(12) United States Patent
Yamanaka et al.

(10) Patent No.: US 7,922,501 B2
(45) Date of Patent: Apr. 12, 2011

(54) SUBSTRATE EARTHING MECHANISM FOR USE IN CHARGED-PARTICLE BEAM WRITING APPARATUS

(75) Inventors: Yoshiro Yamanaka, Shizuoka (JP); Hideo Saito, Shizuoka (JP); Mitsunori Hayashi, Shizuoka (JP)

(73) Assignee: NuFlare Technology, Inc., Numazu-shi (JP)

( * ) Notice: Subject to any disclaimer, the term of this patent is extended or adjusted under 35 U.S.C. 154(b) by 1049 days.

(21) Appl. No.: 11/692,414

(22) Filed: Mar. 28, 2007

(65) Prior Publication Data
US 2007/0228525 A1 Oct. 4, 2007

(30) Foreign Application Priority Data
Mar. 29, 2006 (JP) ................................. 2006-090219

(51) Int. Cl.
*H01R 13/648* (2006.01)
(52) U.S. Cl. ........................................................ 439/95
(58) Field of Classification Search .................... 439/95, 439/109
See application file for complete search history.

(56) References Cited

U.S. PATENT DOCUMENTS

| | | | | |
|---|---|---|---|---|
| 5,073,117 A | * | 12/1991 | Malhi et al. | 439/71 |
| 5,743,749 A | * | 4/1998 | Kurakane | 439/72 |
| 6,508,664 B2 | * | 1/2003 | Phalen | 439/502 |
| 7,317,322 B2 | * | 1/2008 | Farnworth et al. | 324/754.08 |
| 7,608,528 B2 | * | 10/2009 | Tachikawa | 438/487 |
| 2002/0168883 A1 | * | 11/2002 | Phalen | 439/79 |
| 2007/0024864 A1 | * | 2/2007 | Tachikawa et al. | 356/498 |
| 2007/0228525 A1 | * | 10/2007 | Yamanaka et al. | 257/621 |

FOREIGN PATENT DOCUMENTS
JP 2005-32963 2/2005
* cited by examiner

*Primary Examiner* — James Harvey
(74) *Attorney, Agent, or Firm* — Oblon, Spivak, McClelland, Maier & Neustadt, L.L.P.

(57) ABSTRACT

A substrate earthing mechanism includes a plate-like spring extending toward a substrate in a direction parallel to a surface of the substrate, and a contact portion coupled to a tip end of the plate-like spring for coming into contact with the substrate to thereby provide electrical conduction therebetween. The plate spring and the contact portion are laid out so that a contact position at which the contact portion is in contact with the substrate and a layout position of the plate-like spring are substantially the same in position as each other in a direction at right angles to the substrate surface in the state that the plate spring is out of its elastic deformation.

11 Claims, 16 Drawing Sheets

Particle Increase Numbers Before And After Evaluation

| Evaluation Condition | | Particle Increase Number | | | Per-Clamp Number | | |
|---|---|---|---|---|---|---|---|
| Blade Design | Mask Evaluated | 0.2≦D<0.3 | 0.3≦D<0.5 | 0.5≦D<1 | 0.2≦D<0.3 | 0.3≦D<0.5 | 0.5≦D<1 |
| Old Blade | B | 3 | 0 | 5 | 0.10 | 0.00 | 0.16 |
| Old Blade | A | 0 | 1 | 20 | 0.00 | 0.03 | 0.65 |
| New Blade | B | 1 | 0 | 1 | 0.03 | 0.00 | 0.03 |
| New Blade | A | 0 | 0 | 2 | 0.00 | 0.00 | 0.06 |

FIG. 13

SUBSTRATE EARTHING MECHANISM FOR USE IN CHARGED-PARTICLE BEAM WRITING APPARATUS

CROSS-REFERENCE TO RELATED APPLICATION

This application claims priority to Japanese Patent Application (JPA) No. 2006-090219, filed Mar. 29, 2006, the disclosure of which is incorporated herein by reference.

FIELD OF THE INVENTION

The present invention relates generally to energy-beam pattern writing technologies and, more particularly, to charged-particle beam lithographic apparatus. This invention also relates to an earth connection mechanism adaptable for use in the lithography apparatus, for coupling and retaining at ground potential a workpiece to be subjected to lithographic pattern writing using a charged particle beam, such as an electron beam.

DESCRIPTION OF RELATED ART

Lithography is a key technology to advances in further miniaturization of semiconductor circuit devices of ultralarge-scale integration (ULSI) as it includes a process for forming a pattern on substrates, which is very important among semiconductor fabrication processes. In recent years, as ULSI chips further increase in integration density, the circuit linewidth required for semiconductor devices is becoming smaller year by year. To form a desired circuit pattern on a substrate for these downscaled on-chip devices, a highly accurate original or "master" pattern (also known as a reticle or photomask) is needed. In this respect, charged-particle beam pattern writing—typically, an electron beam (EB) lithography—offers inherently excellent image resolutions and thus is suitably adapted for use in the manufacture of such high-accuracy master pattern.

An optics system of a currently known variable-shaped EB lithographic apparatus is shown in FIG. 16. This EB optics includes a pair of upper and lower aperture plates 410 and 420, which are placed beneath an electron beam source 430. Upper aperture plate 410 has a rectangular opening 411 which is almost centrally defined therein for shaping an electron beam 330 as emitted from source 430. Lower plate 420 has a rectangular aperture 421 for variable beam reshaping. Beam 330 from source 430 that passed through upper aperture 411 is deflected by a deflector (not shown). This deflected beam is guided to travel through part of the underlying variable shaping aperture 421 and finally falls onto a workpiece 340 mounted on a movable stage structure, which is driven to continuously move in a horizontal direction, e.g., X-axis direction. With this design, only those rays of electron beam 330 that penetrated both the upper and lower apertures 411 and 421 to have a rectangular cross-section are allowed to reach workpiece 340 for writing a pattern on its top surface. This two-step beam reshaping for creation of a desired beam profile on the workpiece surface is known as the variable beam shaping technique.

In the process of the pattern writing on the workpiece, e.g., a mask substrate, by use of the EB tool, a conductive light shield film which is made for example of chromium (Cr) and which is formed on the substrate surface can be charged electrostatically. This electrification of Cr film affects the travelling route or "orbit" of a pattern-writing electron beam emitted from the beam source. Mere continuous execution of the pattern writing while leaving such Cr film electrification untreated would result in unwanted curvature of the beam orbit. This poses a serious problem as to a decrease in accuracy of an image of line pattern at a target position on the mask surface. Another problem occurrable thereby is the beam defocusing on the mask. One approach to avoiding these problems is to use a technique for forcibly coupling the charged layer to ground potential—that is, grounding or "earthing." An example of this approach is disclosed in Published Unexamined Japanese Patent Application No. 2005-032963 (JP-A-2005-032963).

By using the substrate-earthing technique in EB tools, it becomes possible to increase the pattern writing accuracy.

Unfortunately, the prior known earthing technique is encountered with a specific problem, which is believed to be discovered by the inventors as named herein in the process of conceiving the present invention and thus not disclosed to the public yet. See FIG. 17, which shows a plan view of one typical substrate earthing mechanism 510 for a mask substrate 101 mounted on a stage (not shown). This earthing mechanism 510 includes more than two elastic ground-coupling electrode assemblies, which are brought into contact with corresponding peripheral edge portions of substrate 101 for making electrical conduction therewith. Each ground coupler assembly consists essentially of a blade 514 for contact with the substrate edge and a plate-like spring member 516 associated therewith. As shown in FIG. 18, blade 514 has a slanted inner back surface for contact with a peripheral edge of substrate 101. Plate spring 516 is connected to blade 514 for applying an elastic force thereto to thereby resiliently push and press blade 514 against substrate 101. Although not specifically shown herein, substrate 101 usually has on its surface a Cr light-shield film and its overlying resist film. Plate spring 516 is designed to generate the elastic force that is significant enough for blade 514 to partly break through the resist to come into contact with its underlying Cr film that is electrostatically chargeable during pattern writing, thereby achieving electrical conduction for ground coupling between the film and blade 514.

More specifically, in the substrate earthing mechanism 510 of FIGS. 17-18, the blade 514 is rigidly fixed to a free end of the plate spring 516. The slanted backface of blade 514 is angled at 25 degrees relative to the top surface of substrate 101 as better shown in FIG. 18. When substrate 101 is lifted upward, its upper edge comes into contact with the slanted blade backface. In other words, blade 514 is pushed against it by the elastic force of plate spring 516. With further lift-up of substrate 101, blade 514 partly destroys the resist film atop substrate 101, resulting in blade 514 being electrically connected to its underlying charged Cr film due to electrical contact therebetween with the aid of the elastic force of plate spring 516. Letting a height difference between the blade-to-substrate contact point and the layout position of spring 516 be an offset amount d, this offset is set at 2 mm. Additionally as shown in FIG. 17, blade 514 is adhered to one sideface of plate spring 516 with their longitudinal directions aligned together, thereby to define a distance δ between laterally spaced center axes thereof. Upon creation of the earthing contact between the Cr film of substrate 101 and the blade 514, contaminant particles are producible from its overlying resist film as blade 514 cuts into this resist film. These particles fall down and become attached to the pattern-written substrate surface. This appreciably reduces the quality of resultant mask pattern while reducing manufacturing yields and throughputs.

Turning to FIG. 19, there is shown an in-plane distribution of residual contaminant particles on the substrate after completion of the pattern writing using EP tool having the earthing mechanism shown in FIGS. 17-18. As apparent from this graph, an unacceptably increased number of contaminants reside on the substrate in its pattern-written area.

FIG. 20 shows actually observed blade traces or "scars" formed on a substrate which is coupled to ground by the earthing mechanism shown in FIGS. 17 and 18. As shown in FIG. 20, in case this earthing mechanism is used for substrate grounding, one blade cuts into the resist material at a single earthing location. In spite of this, however, a plurality of—here, two—blade traces remain as demonstrated by the observation macrophotograph of FIG. 20. It appears that the formation of multiple blade traces results in a likewise increase in cutaway amount of the resist material.

As apparent from the foregoing, it is inevitable for grounding a charged layer to partially remove its overlying resist material and then earth the charge layer. However, even in such case, it is required to lessen or minimize the amount of contaminant particles attached to the substrate being processed.

BRIEF SUMMARY OF THE INVENTION

It is therefore an object of this invention to provide an improved ground-coupling or "earthing" mechanism capable of avoiding the above-stated problems and reducing the amount of residual contaminant particles on a substrate in the process of pattern writing. Another object of the invention is to provide a charged-particle beam lithographic apparatus using the substrate earthing mechanism.

In accordance with one aspect of the invention, a substrate earthing mechanism includes a plate-like spring member extending toward a substrate in a direction parallel to the surface of the substrate, and a contact portion which is coupled to a free end of the plate spring and is contactable with the substrate to thereby provide electrical conduction therebetween. The plate spring and the contact portion are laid out in a way such that a contact position at which the contact portion is in contact with the substrate and a layout position of the plate spring are substantially the same in position as each other in a direction perpendicular to the substrate surface in a state that the plate-like spring is not yet elastically deformed.

In accordance with another of the invention, a charged-particle beam writing apparatus includes a stage structure mounting thereon a substrate to be written with a pattern by using a charged particle beam and being driven to move up and down for adjustment of the mount level or height of the substrate. The apparatus also includes an earthing mechanism for forcibly coupling the substrate to ground potential. The earthing mechanism includes a contact portion which is contactable with the substrate by elevation of the substrate to thereby make electrical conduction with the substrate, and a plate-like spring member extending toward the substrate in a direction parallel with the surface of the substrate for causing the contact portion to be electrically connected thereto at a the tip end of the plate spring or at a nearby part thereof. The contact portion and the plate spring are laid out so that a contact position at which the contact portion comes into contact with the substrate and a layout position of the plate spring are substantially the same as each other with respect to the elevating direction of the stage in a state that the plate spring is not yet elastically deformed.

BRIEF DESCRIPTION OF THE DRAWINGS

FIG. 13 is a diagram showing in a table format the on-substrate residual particle numbers of the graph of FIG. 12.

DETAILED DESCRIPTION OF THE INVENTION

In respective embodiments as disclosed herein, an electron beam is used as an example of the charged particle beam for pattern writing, although the electron beam may be replaced by other similar suitable beams, such as an ion beam or else.

Figure 1:
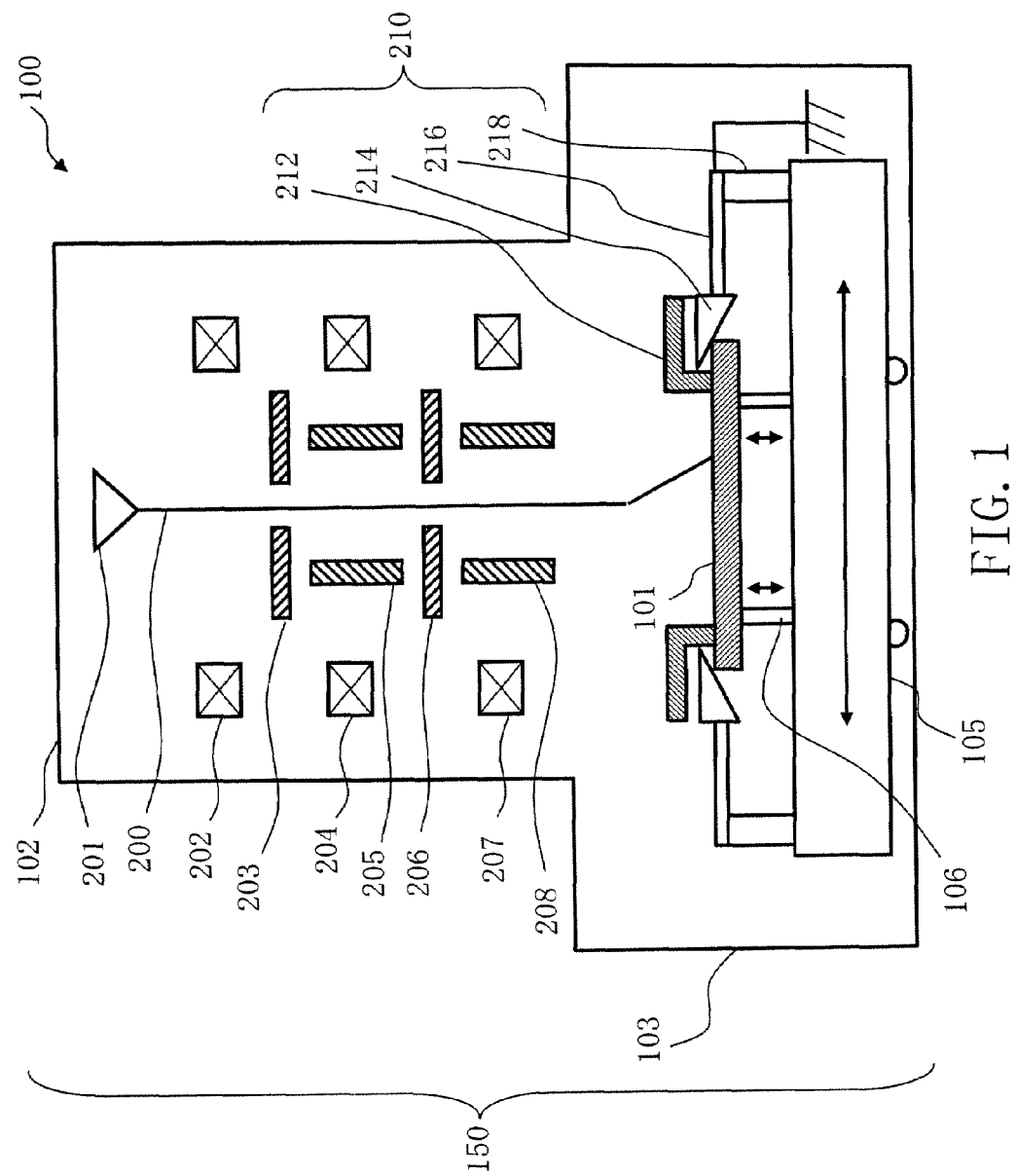
FIG. 1 is a diagram schematically showing an overall arrangement of an electron-beam lithography apparatus in accordance with one embodiment of the present invention.

Referring to FIG. 1, a variable-shaped electron beam (EB) lithographic apparatus is generally indicated by reference numeral 100. This EB lithography apparatus 100 is for writing a predetermined ultrafine circuit pattern on the surface of a workpiece under production-here, a mask substrate 101 as an example. As shown in FIG. 1, the EB tool 100 is generally made up of an electron optics housing 102, called the lens/mirror barrel, an X-Y stage structure 105, an electron gun assembly 201, an illumination lens 202, an upper or "first" aperture plate 203, a projecting lens 204, a deflector 205, a lower or "second" aperture plate 206, an objective lens 207, a deflector 208, and an earthing mechanism having contact electrode assemblies 210 for forcibly connecting the substrate 101 to ground or earth potential. A respective one of the substrate-earthing contact electrode structures 210 includes a cover 212, blade 214, plate-like spring 216, and fixation member 218. The blade 214 has a contact portion which is contactable with the outer periphery of substrate 101 and thus functions as a ground connecting or "earthing" electrode.

The electron lens barrel 102 contains in its interior space the electron gun 201, illumination lens 202, first aperture 203, projective lens 204, deflector 205, second aperture 206, objective lens 207 and deflector 208. The substrate earthing mechanism with contact electrodes 210 and the XY stage 105 are received in a lithography chamber 103. XY stage 105 has an ensemble of upstanding pins 106 for stably supporting the substrate 101 as mounted thereon. These substrate-supporting pins 106 are elevatable—that is, movable upward and downward to thereby locate substrate 101 to a desired level of height over XY stage 105. Note here that some major components of EB tool 100 concerning the principles of this invention are depicted in FIG. 1, although other necessary parts may be included therein.

Rays of an electron beam 200 emitted from the electron gun 201 are collected together by the illumination lens 202. Then, the electron beam falls onto an entire surface area of the first aperture plate 203 having its opening, which may be a rectangular hole for shaping the incoming electron beam 200 into a rectangular shape. The electron beam 200 that has passed through the first aperture 203 is then projected by projection lens 204 onto the second aperture 206. The position an image of first aperture 203 on second aperture 206 is controlled by the deflector 205, thereby enabling the beam to vary both in shape and in size. An electron beam 200 of the second aperture image that has passed through second aperture 206 is then guided to hit the objective lens 207 for focusing adjustment. The resulting beam is then deflected by deflector 208 to finally fall onto the top surface of substrate 101 at a desired position. During such beam irradiation, the XY stage 105 is driven by an actuator (not shown) to move in X and Y directions in a horizontal plane as indicated by arrows in FIG. 1.

In the process of such electron-beam pattern writing on the substrate 101, the electron lens barrel 102 and lithography chamber 103 are evacuated by a vacuum pump (now shown) so that the inner space of each is set in a vacuum or in a low-pressure environment with its pressure lower than atmospheric pressures.

Figure 2:
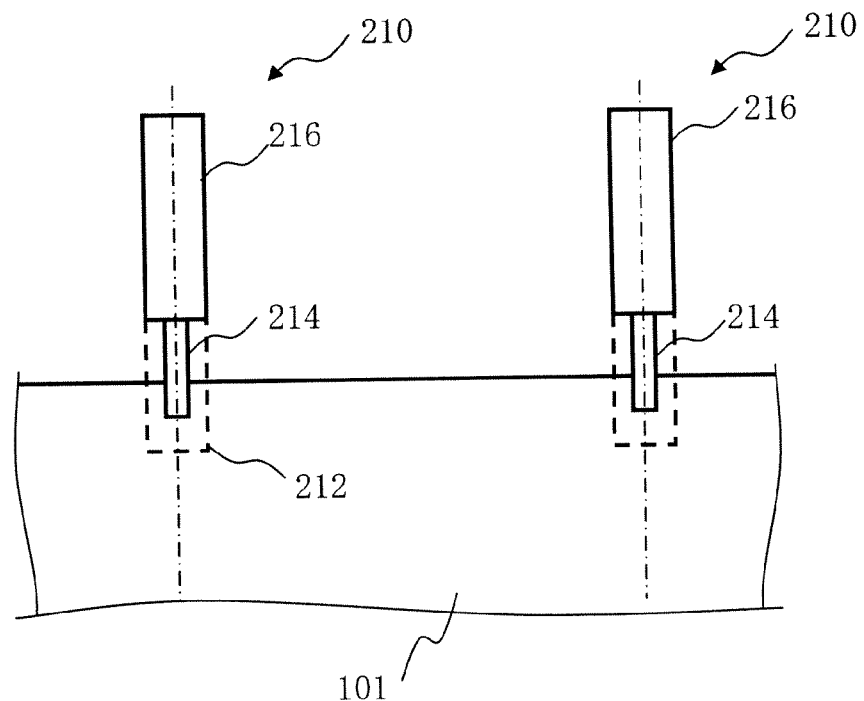
FIG. 2 is a top plan view of part of a substrate earthing mechanism used in the lithography apparatus of FIG. 1.
Figure 3:
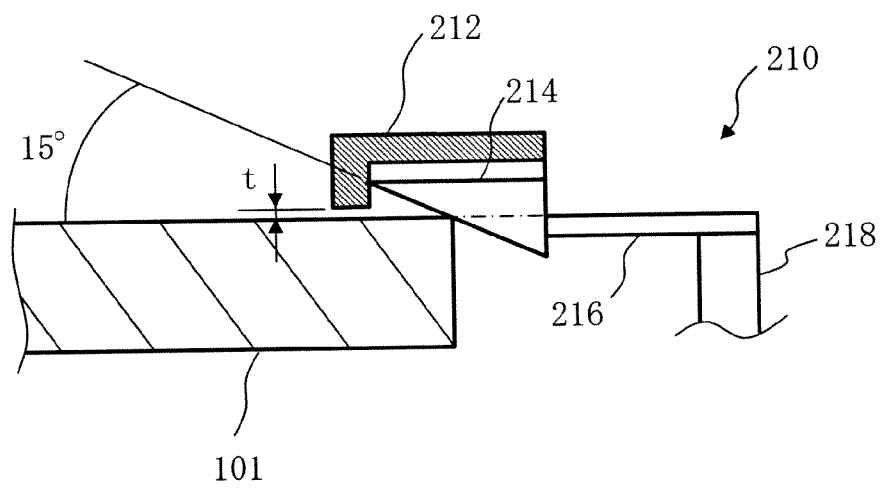
FIG. 3 is a side view of main part of the substrate earthing mechanism.

As shown in FIG. 2, the earthing mechanism includes more than two contact electrode assemblies 210, which are provided along one side of the substrate 101 in the EB lithography apparatus 100. As shown in FIG. 3, the individual substrate-earthing contact electrode 210 has an elongate plate-like spring 216 which is rigidly fixed by a fixing member 218 on the XY stage 105. The plate spring 216 extends toward substrate 101 in a parallel direction to the substrate surface. Plate spring 216 has a free end, to which coupled is a blade 214 that has a slanted or "sloped" inner surface for contact with the peripheral edge of substrate 101 with a contact angle of, for example, fifteen degrees (15°) and a sharpened tip, like a knife edge; thus, blade 214 has a triangular cross-section. Blade 214 is disposed at an almost central position of plate spring 216 along the width, with their extending directions aligned together as shown in FIG. 2. Specific layout design is used so that a contact position of blade 214 with substrate 101 is substantially the same as a layout position of plate spring 216 in the direction at right angles to the substrate surface in an initial state that plate spring 216 is not yet elastically deformed. In other words, the contact position of blade 214 with substrate 101 is almost the same in height as the layout position of plate spring 216. As better shown in FIG. 3, blade 214 is covered with cover 212, which overlies a flat upper surface of blade 214. This blade cover 212 has, at its front end corresponding to the knife edge of blade 214, a downward extending portion like a veil. This veil has its undersurface which defines a space gap t between it and the substrate surface. More specifically, cover 212 "roofs" blade 214 while maintaining the gap t relative to the substrate surface at a selected position in the direction extending from the contact position of blade 214 with substrate 101 toward the center of this substrate.

Figure 4:
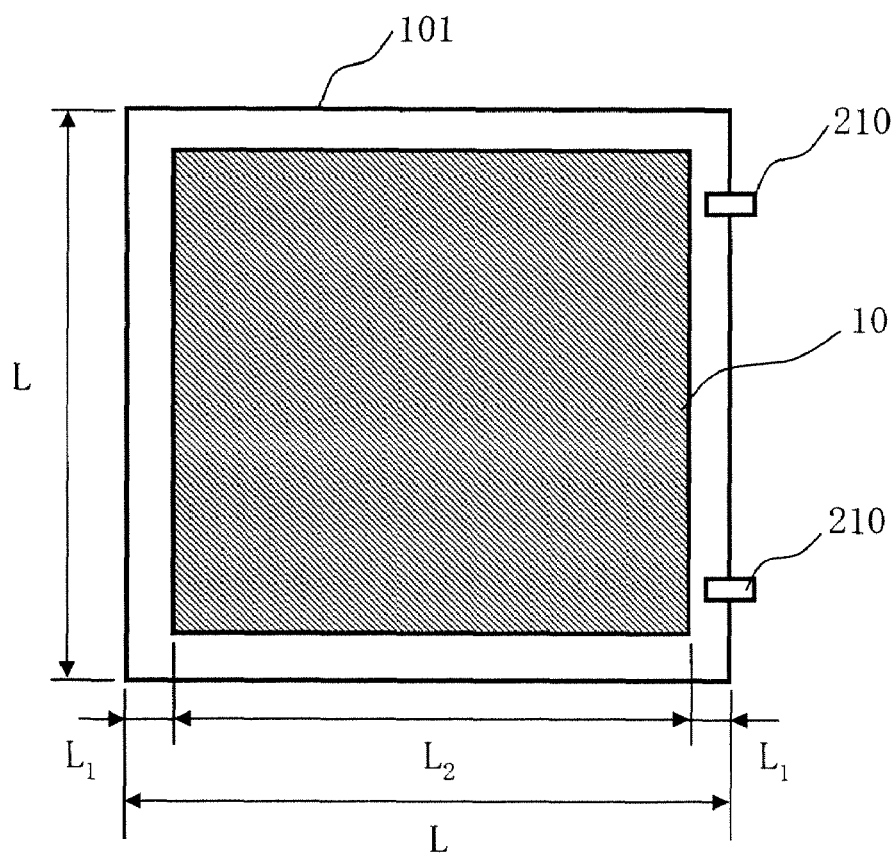
FIG. 4 is a plan view of one exemplary substrate in the EB lithography apparatus.

An example of the substrate 101 is shown in FIG. 4, which is a photomask substrate with a square planar shape. This mask substrate has each side length L of 152 mm, for example. Along one side edge of it, a couple of spaced-apart earthing contact electrodes 210 are disposed. The mask has its top surface in which a square pattern-writing region 10 is defined to have a marginal distance L1 from each peripheral edge thereof. Thus, the pattern write region 10 has an area of L2×L2. In this example, L is set to 152 mm, L1 is 6 mm, and L2 is 140 mm. Obviously, the area of pattern writing is an inner square region with its each side ranging from a position that is spaced by 6 mm from its corresponding substrate edge and a position of 146 mm therefrom.

Figure 5:
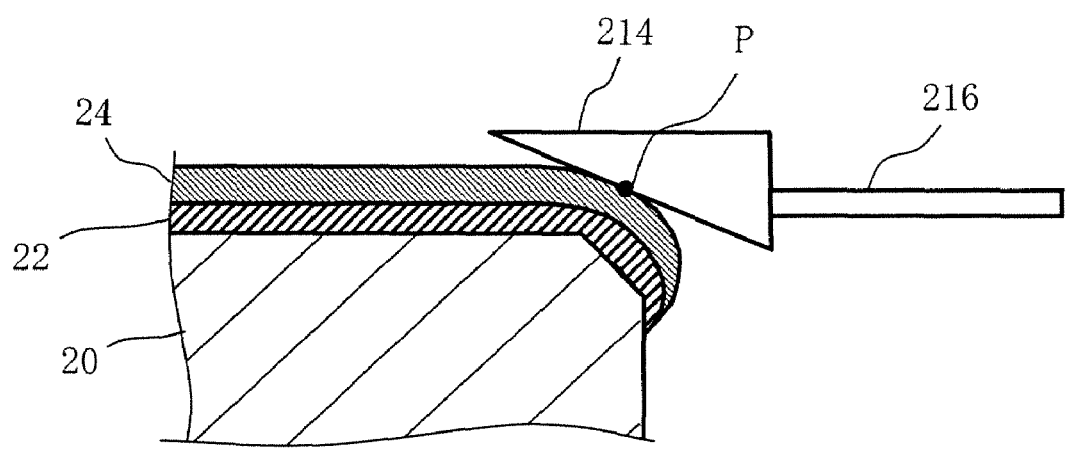
FIG. 5 is an enlarged partial sectional view of the substrate which begins to come into contact with a blade of the earthing mechanism.

Turning to FIG. 5, a state that the blade 214 begins to come into contact with the mask substrate is shown in enlarged partial cross-section. The mask substrate shown herein is a glass substrate 20 to be pattern-written by an electron beam. Glass substrate 20 has on its top surface a multilayer of a light shield film 22 made of chromium (Cr) and a film 24 of resist material. The Cr light shield film 22 is an example of a conductive film required. Mask substrate 20 is mounted on the support pins 106 on XY stage 105. These pins 106 are elevatably driven to move upward in the optical axis direction of electron beam, i.e., along Z axis perpendicular to the X-Y plane, causing substrate 20 to come into contact with the blades 214. As shown in FIG. 5, each blade 214 is in contact with resist film 24 at a point P on its sloped inner face. This point P is a substrate contact-starting position. As the illustrated state is at an instant that blade 214 is in first touch with substrate 20, the plate spring 216 coupled to blade 214 does not yet exhibit elastic deformation. Recall here that the contact position P and the layout position of plate spring 216 are specifically arranged so that these are substantially the same as each other in height—that is, the level in the elevating direction of XY stage 105, as stated previously.

Figure 6:
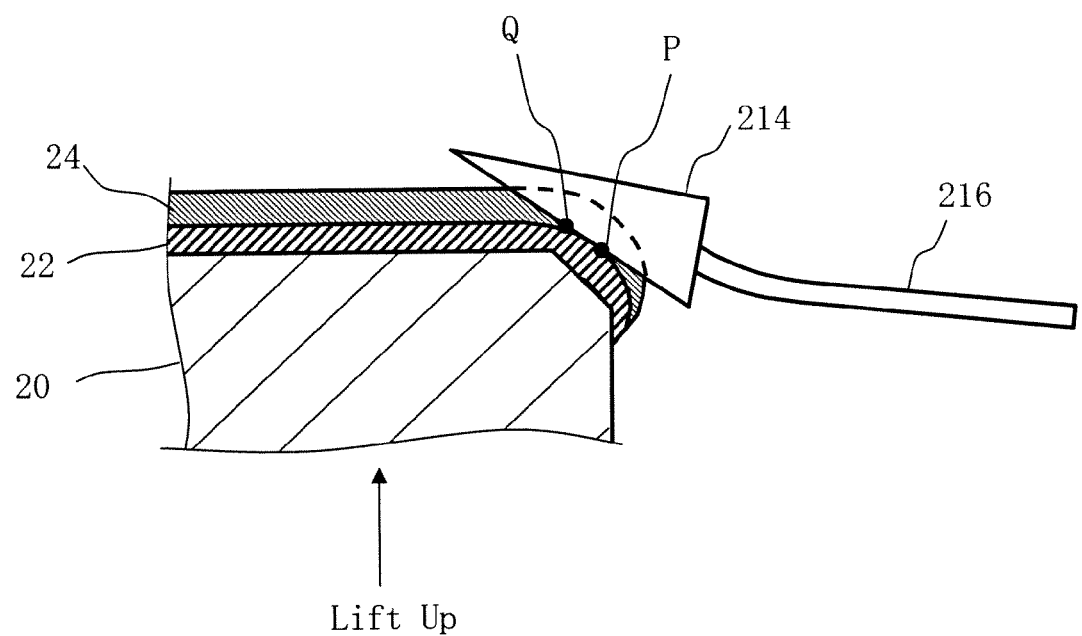
FIG. 6 is an enlarged partial sectional view of the substrate which is finally conducted with the blade.

See FIG. 6, which shows a subsequent state of the blade 214 being electrically fully conducted with the mask substrate 20. When driving the substrate support pins 106 to further elevate to lift up substrate 20 in the Z direction, the blade 214 being in contact with resist film 24 is raised up, resulting in the plate spring 216 becoming elastically deformed accordingly. At last, as shown in FIG. 6, the elastic force of plate spring 216 causes blade 214 to partly break through resist film 24 to come into contact with its underlying Cr film 22 so that electrical conduction is established between blade 214 and Cr film 22. Although not specifically depicted herein, if a layer of Cr oxide ($CrO_x$) is formed on Cr film 22, blade 214 bites and cuts thereinto to make electrical conduction with Cr film 22. This contact with Cr film 22 for conduction permits blade 214 to serve as an electrical contact point for coupling Cr film 22 to ground potential—i.e., earthing of mask substrate 20. This earthing enables any electrical charge residing on Cr film 22 to escape from substrate 20. It is noted here that when blade 214 partly cuts away resist film 24, blade 214 must be dragged or slipped thereon. This to results in the contact start point P being shifted to a point Q at which blade 214 is finally contacted with Cr film 22. Such pressure-applied blade slippage causes unwanted production of contaminant particles from the partly destroyed resist film 24.

Figure 7:
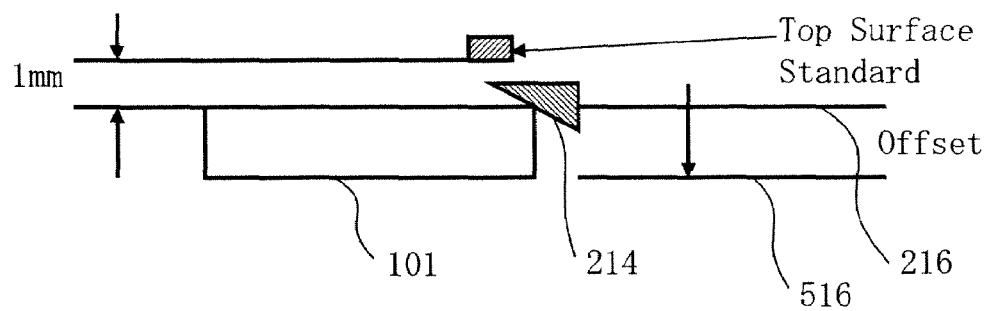
FIG. 7 is a pictorial representation of a plate-like spring having its layout height relative to the contact starting height of the blade against the substrate.
Figure 8:
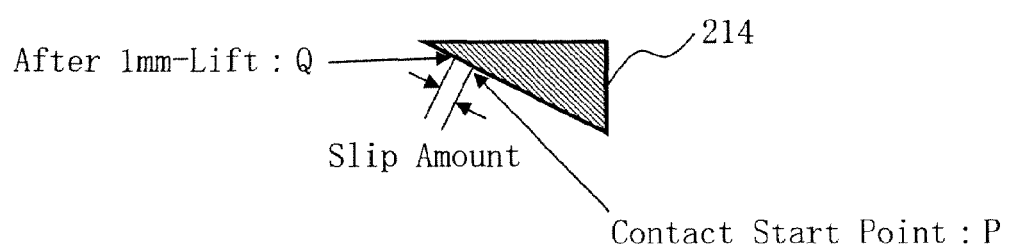
FIG. 8 is diagram pictorially showing a relation of the contact start position and the conducted position.
Figure 17:
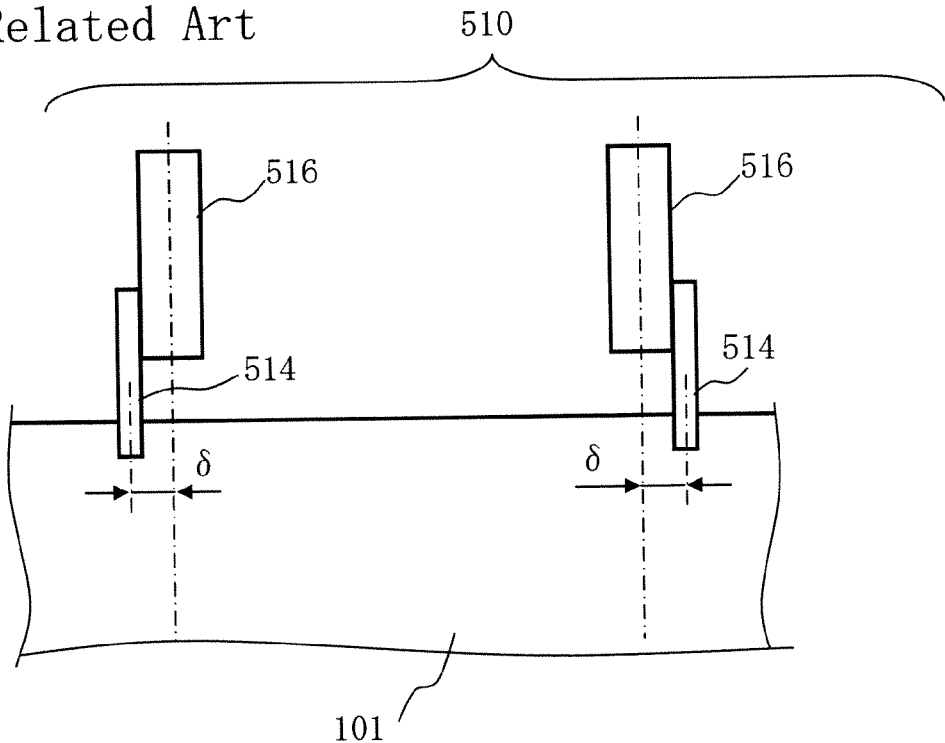
FIG. 17 is a top plan view of a substrate earthing mechanism used in the EB lithography apparatus.
Figure 18:
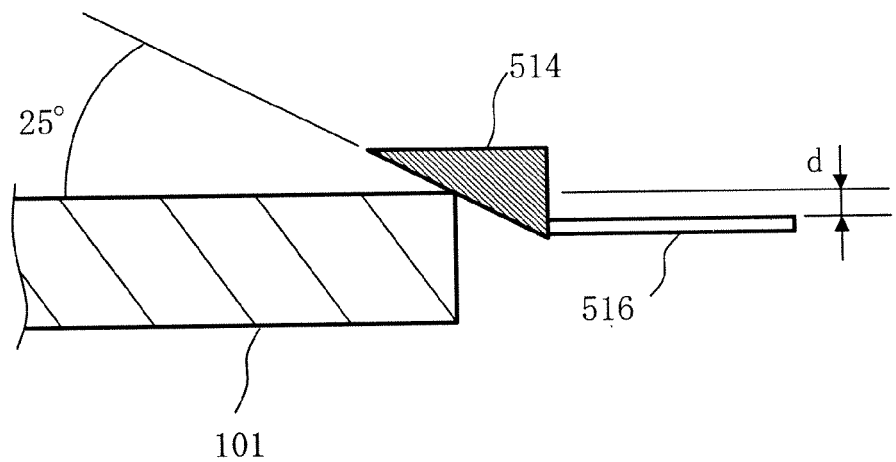
FIG. 18 is a side view of main part of the earthing mechanism in the lithography apparatus.

The blade 214's slip distance is variable depending upon the height of initial contact position and the layout height of plate spring 216 and also the offset amount between the initial contact point P and the finally settled contact point Q for electrical conduction shown in FIG. 6. In other words, the blade slip distance is well controllable by appropriately setting the values of these parameters. In this embodiment, as shown in FIG. 7, the height of a position at which blade 214 begins to come into contact with a workpiece, e.g., substrate 101, is made equal to the layout height of plate spring 216. On the contrary, the prior known substrate earthing mechanism 510 shown in FIGS. 17-18 is arranged so that the height of such contact starting position is deviated by an offset amount d (e.g., 2 mm) from the layout height of plate spring 516. In case substrate 101 is lifted up by a height of 1 mm, the contact point is dragged from the start point P down to the shifted point Q. The relationship among the contact start position height and the plate spring layout height and the offset amount will be discussed below.

Figure 9:
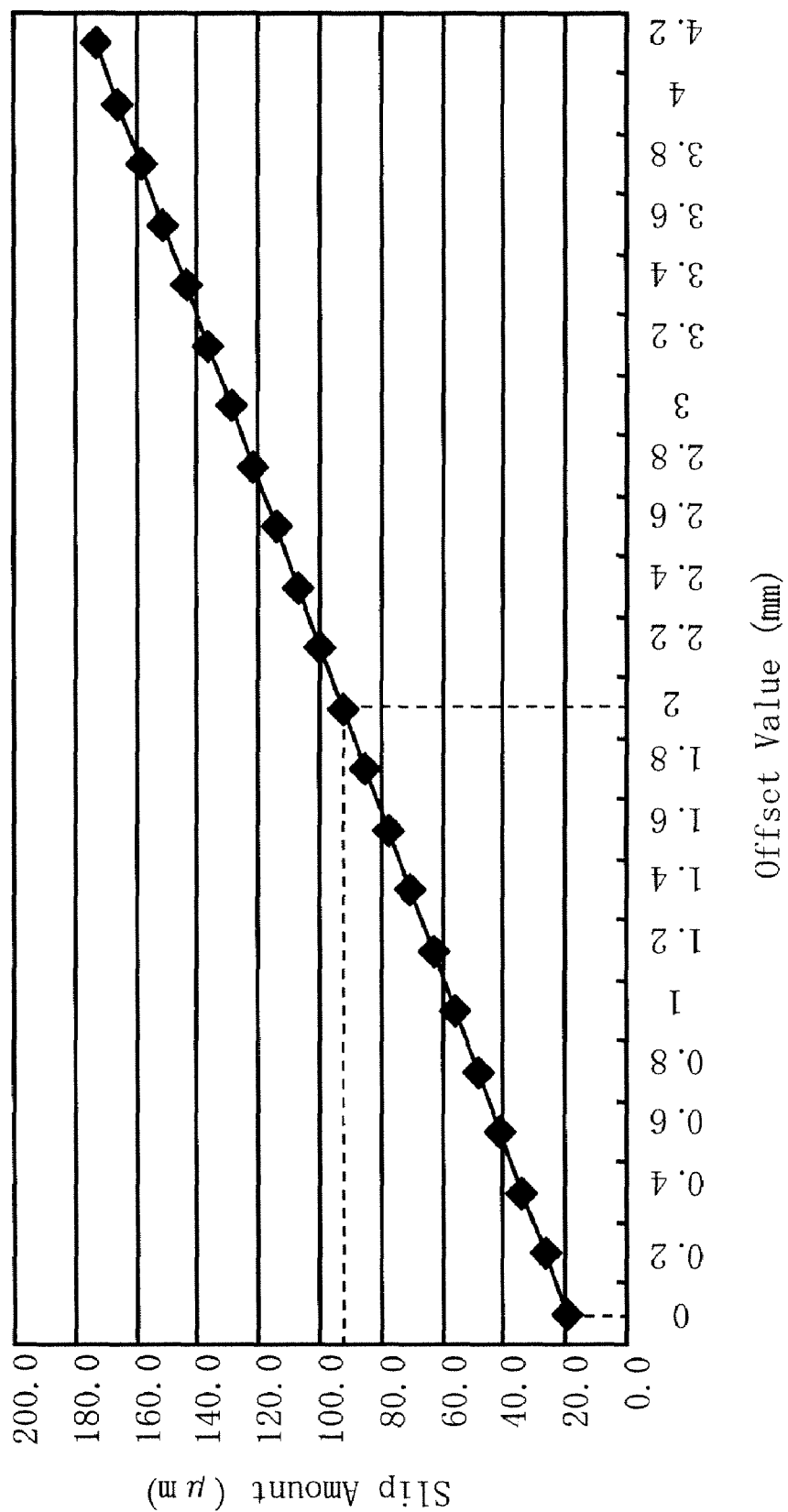
FIG. 9 is a graph showing plots of a drag or "slip" amount relative to offset values between the height of contact start position and the layout height of the plate spring.

A line of measurement plots indicative of the parameter relationship is shown in FIG. 9. As apparent from this graph, in the case of the prior known plate spring 516 being disposed at a position with the offset amount of 2 mm, the blade's slipped distance was about 95 µm. In contrast, the plate spring 216 of this embodiment is laid out so that the offset amount falls within plus/minus (±) 1 mm. In other words, the value of an offset between the initial contact position at which blade 214 begins to come into contact with substrate 101 and the layout position of plate spring 216 is within 1 mm. The offset value here is in the perpendicular direction to the surface of substrate 101—that is, in the direction along the height of substrate 101, which is equivalent to the Z-axis direction. With such offset value setting, it is possible to greatly reduce the slip distance of blade 214 once after its first contact with substrate 101. For example, setting the offset value at zero (0) permits the slip distance to drop down at 20 µm. This makes it possible to lessen the amount of contaminant particles to be produced due to the blade's slippage on the resist material of substrate 101.

Figure 10:
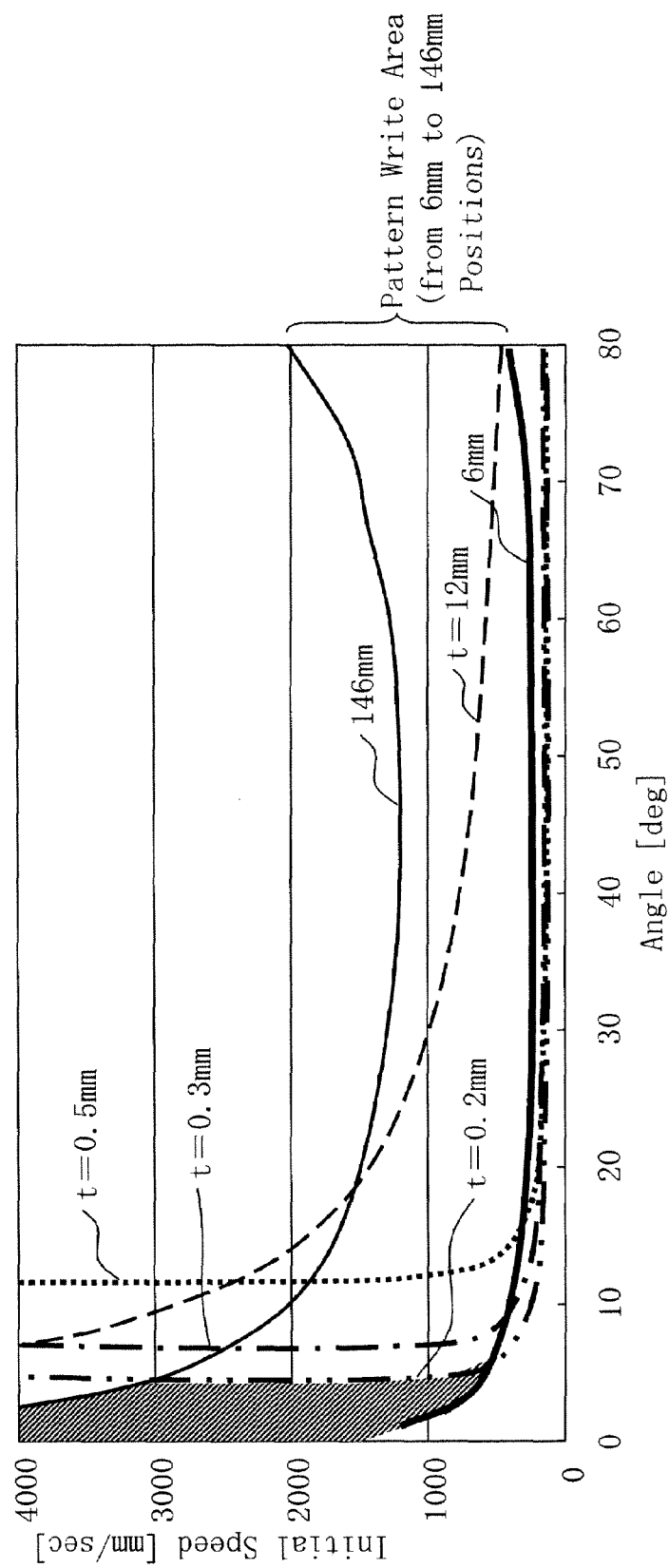
FIG. 10 is a graph showing curves of initial speed versus particle flying angle of particles.

The contaminant particles that scatter and fly out of the substrate's resist film exhibit certain relationship between angle and initial velocity. Curves of measured values thereof are graphically shown in FIG. 10. Recall that in this embodiment, blade 214 is spatially covered with its overlying cover 212. Here, the effect of such cover 212 was evaluated by simulation. The values plotted in FIG. 9 graph were measured using a sample substrate that is similar to the substrate 101 shown in FIG. 4. As previously stated in the example of FIG. 4, letting L1=6 mm and L2=140 mm of square substrate with each side length L (=2L1+L2) of 152 mm, its pattern write region is a surface area having a side length equal to the distance between a point spaced by 6 mm from an edge and a point spaced therefrom by 146 mm. In the graph of FIG. 10, a curve of initial speed of particle versus its fly-off angle is plotted, wherein the initial speed is defined by the speed of a particle that arrives at the position spaced by 6 mm from the substrate edge. Similarly, a curve of initial speed and angle is also plotted in this graph, wherein the initial speed here is the speed of a particle that reaches the other position distant by 146 mm from the substrate edge. An inside region enclosed by these curves is the substrate's pattern writing area. Obviously it is desirable that no particles reach such area. Consequently in FIG. 10, the cover 212's particle scattering suppression effect was evaluated through simulation while varying the value of the gap t between substrate 101 and cover 212 shown in FIG. 3. Here, the distance between the contact position of blade 214 and the inside face of cover 212 was set to 2.5 mm. It can be seen from viewing the graph of FIG. 10 that the cover effect increases as gap t becomes narrower. Thus, covering or "roofing" the blade 214 with cover 212 makes it possible to suppress unwanted spreading of contaminant particles which can fall onto the substrate. Our experimentation revealed that the particle spreading suppression effect is maximized by setting the gap t at 0.5 mm or less.

It has been stated that the substrate earthing mechanism of this embodiment is arranged to comprise the contact electrodes 210 each including the cover 212 which overlies and spatially wraps blade 214 and which has, as better shown in FIG. 3, a vertically bent and downward extending veil-like front flange on its blade tip side. The "veil" of cover 212 is contacted on its inner wall with the knife edge-like sharp end of blade 214—this blade end is headed to the center of substrate 101 from the substrate-contact position of blade 214—and has an undersurface that opposes the top surface of substrate 101 with the gap space t being kept therebetween. With this blade cover structure, even when contaminant particles are yielded from the on-substrate resist material due to the blade 214's slippage thereon after its contact with the periphery of substrate 101, it is possible to prevent such contaminants from flying out to a non-peripheral surface region of substrate 101, i.e., the pattern-writing area.

Figure 11:
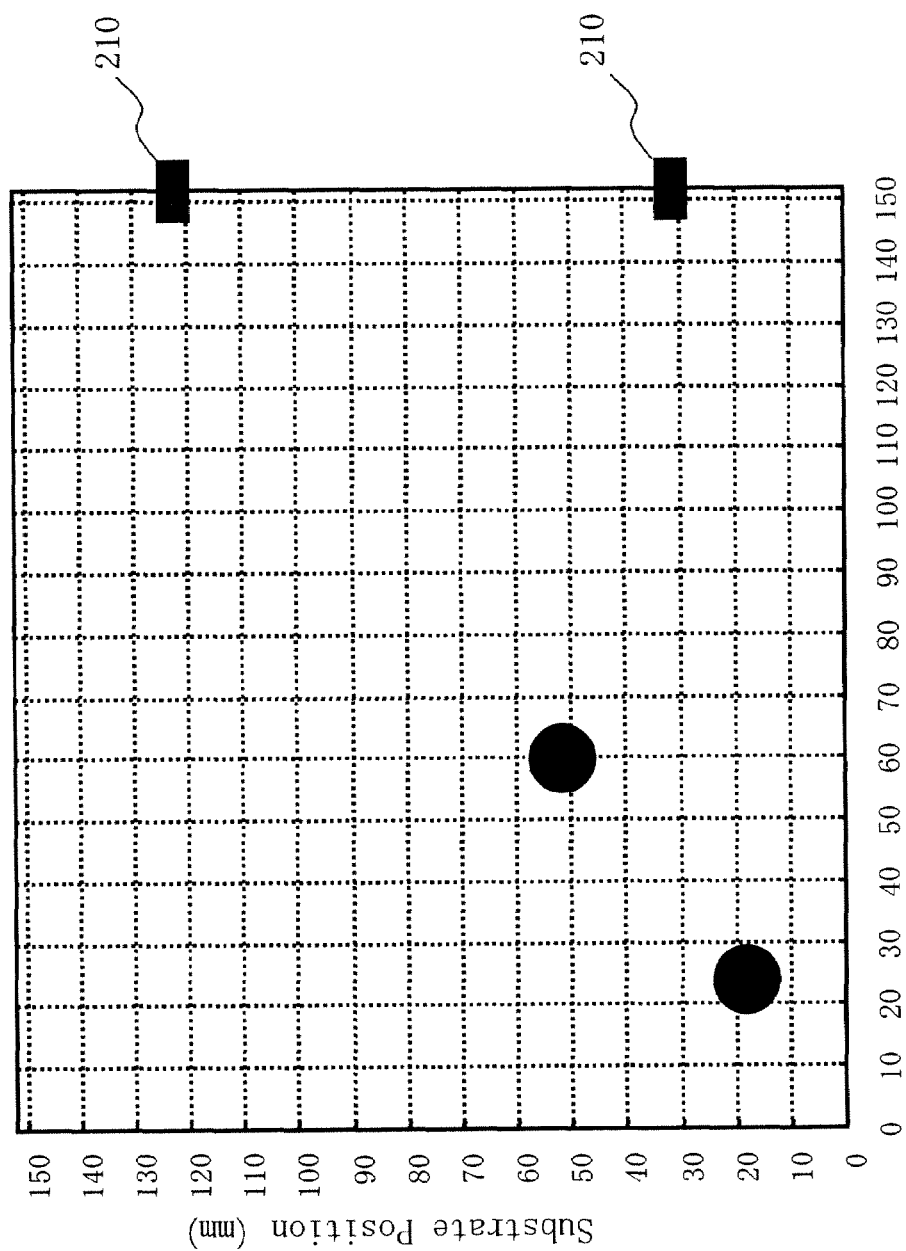
FIG. 11 is a graphical representation of contaminant particles attached onto the top surface of a substrate which is coupled to ground by use of the earthing mechanism embodying the invention.

Referring to FIG. 11, there is shown an inplane distribution of residual contaminant particles on substrate 101 in its pattern write area, which substrate is grounded by the earthing mechanism with contact electrodes 210 of this embodiment. It can be seen that the residual particles are appreciably reduced in number when compared to those shown in FIG. 19.

Figure 12:
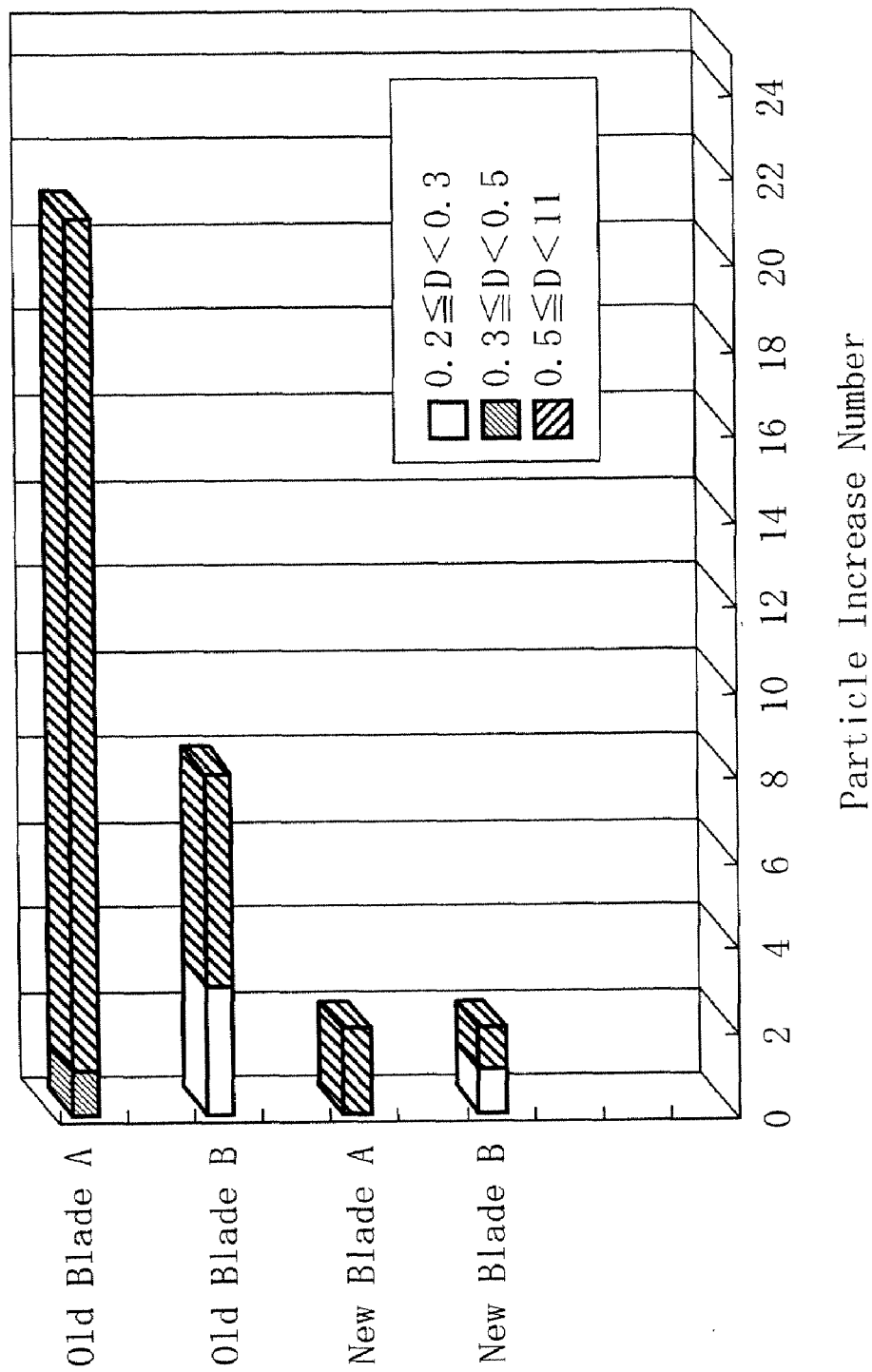
FIG. 12 is a bar graph showing several measured numbers of residual particles on substrates that are grounded by the embodiment earthing mechanism and by prior known mechanism.

Turning to FIG. 12, residual particle numbers are indicated relative to different earthing blades. The numbers were each measured after having clamped for earthing either one of two different kinds of sample substrates A and B for thirty times using the prior art blades 514 or the embodiment blades 214. More specifically, "Old Blade A" indicates the case where substrate A is clamped by the earthing mechanism having blades 514 shown in FIGS. 17-18. "Old Blade B" is the case where substrate B is clamped by the earthing mechanism using the blades 514. "New Blade A" indicates the case where substrate A is clamped by the earthing mechanism having blades 214 shown in FIGS. 2-3. "New Blade B" is the case where substrate B is clamped by the earthing mechanism with blades 214. As apparent from this chart, use of the embodiment earthing mechanism makes it possible to reduce the absolute number of contaminant particles while lessening particles of respective sizes.

The contents of the FIG. 12 graph is shown in FIG. 13 in table form. More specifically, this table shows an increase number of each size of particles in case the substrate is clamped for thirty times along with a per-clamp increase number of each size of particles. This table well demonstrates successful achievement of the embodiment's effects in reducing the absolute number of contaminant particles and also in lessening each size of particles.

Figure 14:
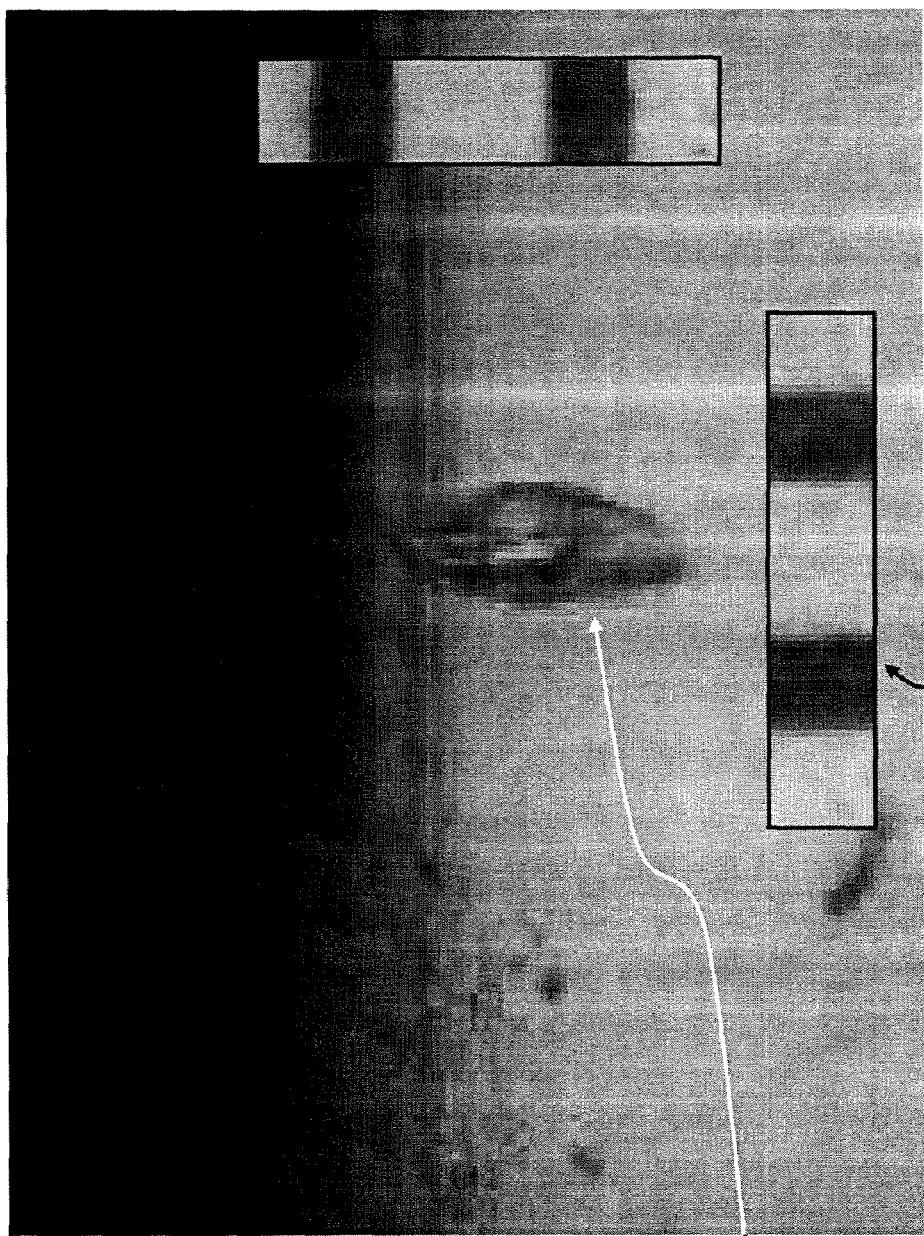
FIG. 14 a macrophotograph showing an observed blade trace as formed on the substrate that is grounded by the embodiment earthing mechanism.
Figure 19:
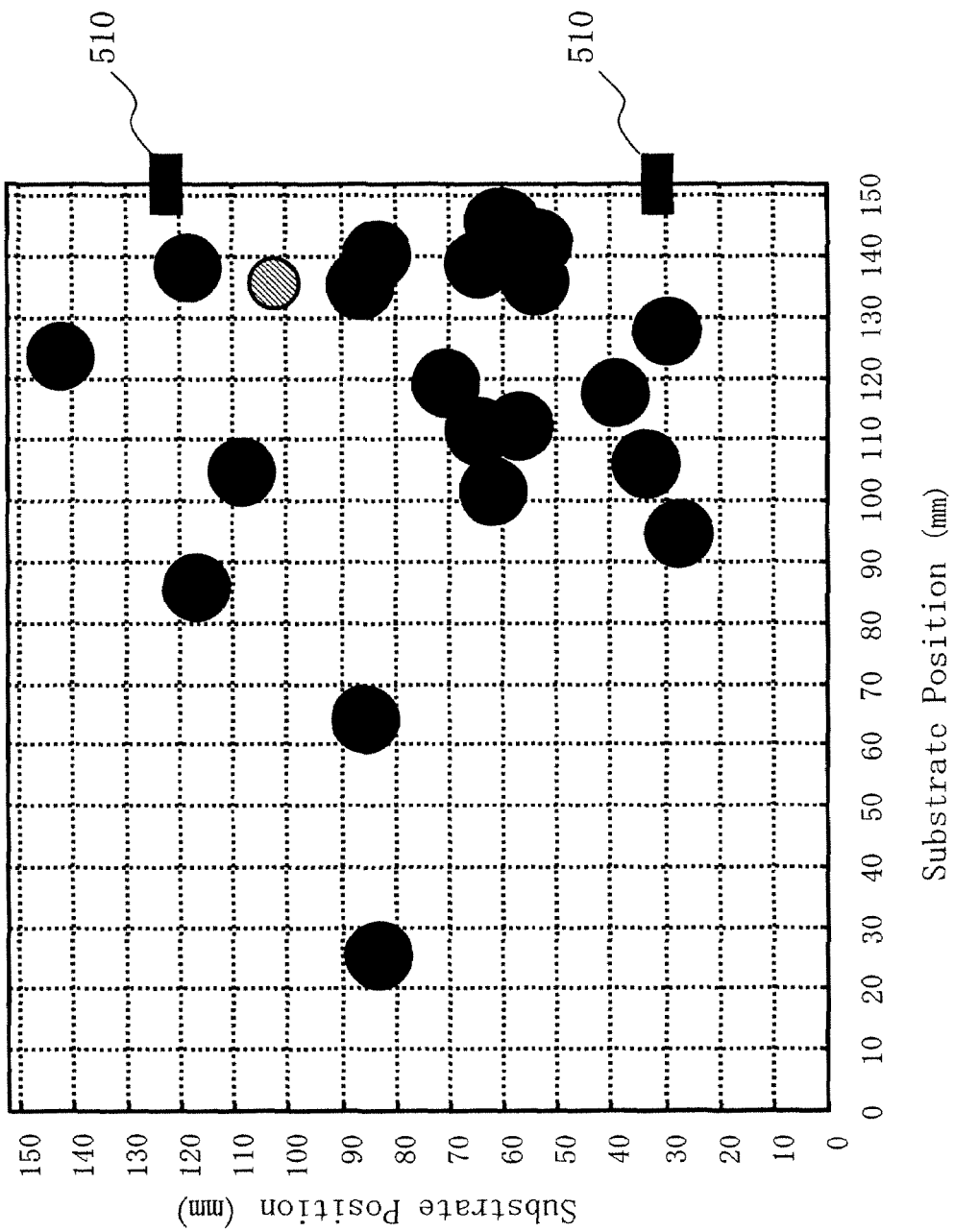
FIG. 19 is a graphical representation of contaminant particles attached to the top surface of a substrate which is coupled to ground by use of the earthing mechanism shown in FIGS. 17-18.
Figure 20:
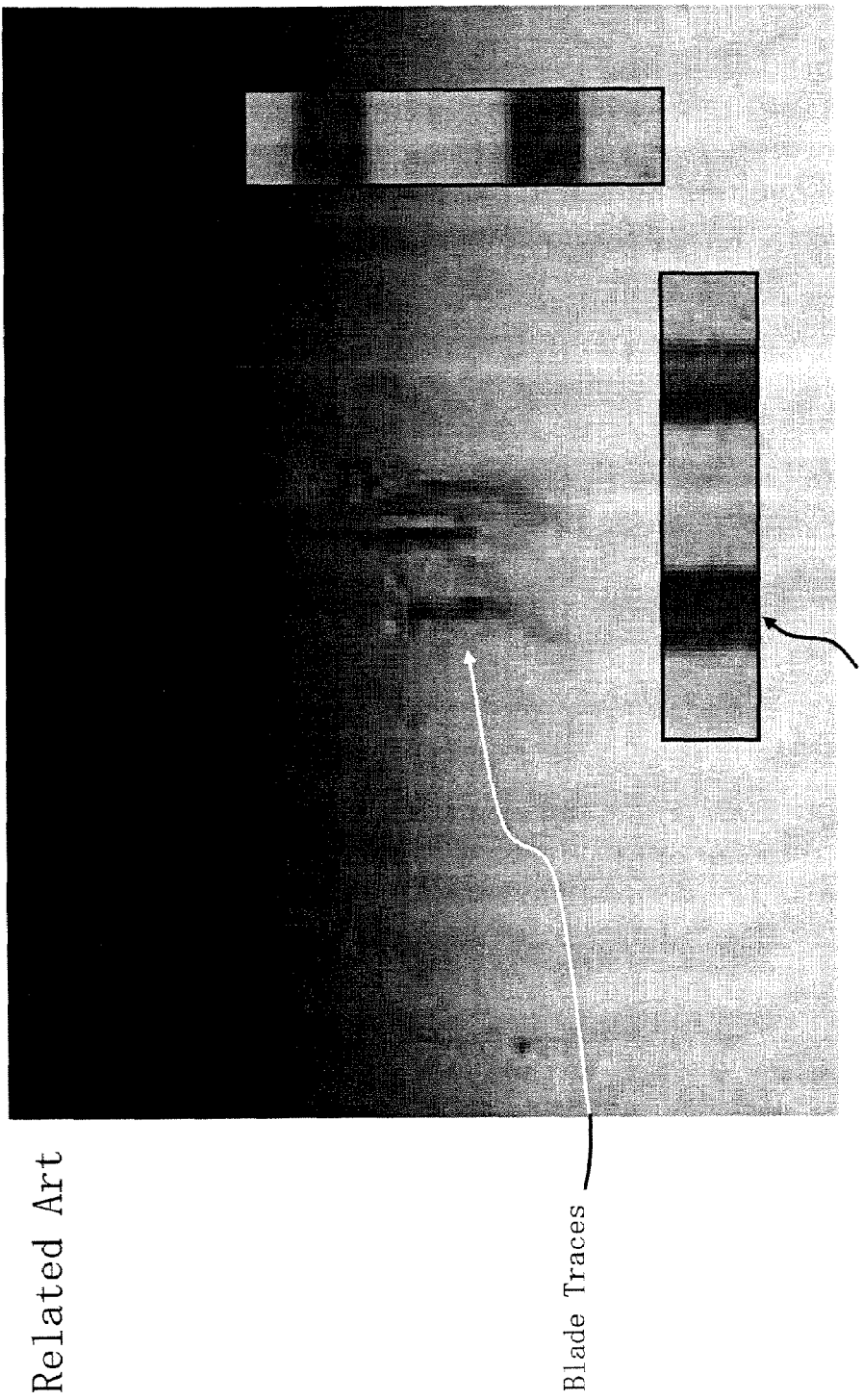
FIG. 20 is a macrophotograph showing several observed blade traces formed on the substrate that is grounded by the earthing mechanism of FIGS. 17-18.

An observation macrophotograph of blade scratch trace on a substrate grounded by the earthing mechanism of this embodiment is shown in FIG. 14. Although in the earthing mechanism of FIGS. 18-19 more than two blade traces are formed in spite of the fact that a single blade cuts into resist material as shown in FIG. 20, use of the embodiment mechanism results in only one blade trace being left as seen from FIG. 14. Recall here that the blade 514 shown in FIGS. 18-19 is merely attached to one sideface of plate spring 516 whereby a difference 5 along the width is kept between their longitudinal center lines indicated by broken lines in FIG. 17. Our study and experimentation have revealed that the creation of many blade traces is mainly due to the torsional deformation of plate spring 516 upon lift-up of the substrate after blade 514 is in contact therewith. In light of the discovery, the embodiment earthing mechanism is arranged to dispose blade 214 at the central position along the width of plate spring 216: in other words, blade 214 is fixed to spring 216 so that their longitudinal centerlines are aligned together as shown in FIG. 2. With this blade layout, the spring 216's torsion becomes controllable so that displacement of blade 214 is suppressed, resulting in an appreciable decrease in number of blade traces as shown in FIG. 14. Preferably, blade 214 is so disposed that the offset value from the center of plate spring 216 along its width is within ±1 mm. The blade trace reducibility brings a likewise decrease in amount of resist material to be cut away by blade 216.

As apparent from the foregoing, the substrate earthing mechanism embodying the invention is capable of greatly lessening the degree of slippage of blade 214 on the resist film atop substrate 101, thereby reducing the amount of contaminant particles producible from the resist during pattern writing. Another advantage of this embodiment lies in an ability to suppress positional deviation of blade 214 owing to the capability of minimizing the risk of torsion or twisting of plate spring 216. Furthermore, roofing or "wrapping" blade 214 with cover 212 makes it possible to restrain fly-out and scatter of contaminant particles yielded. This makes it possible to reduce the number of particles attempting to attach to the substrate being processed.

Figure 15:
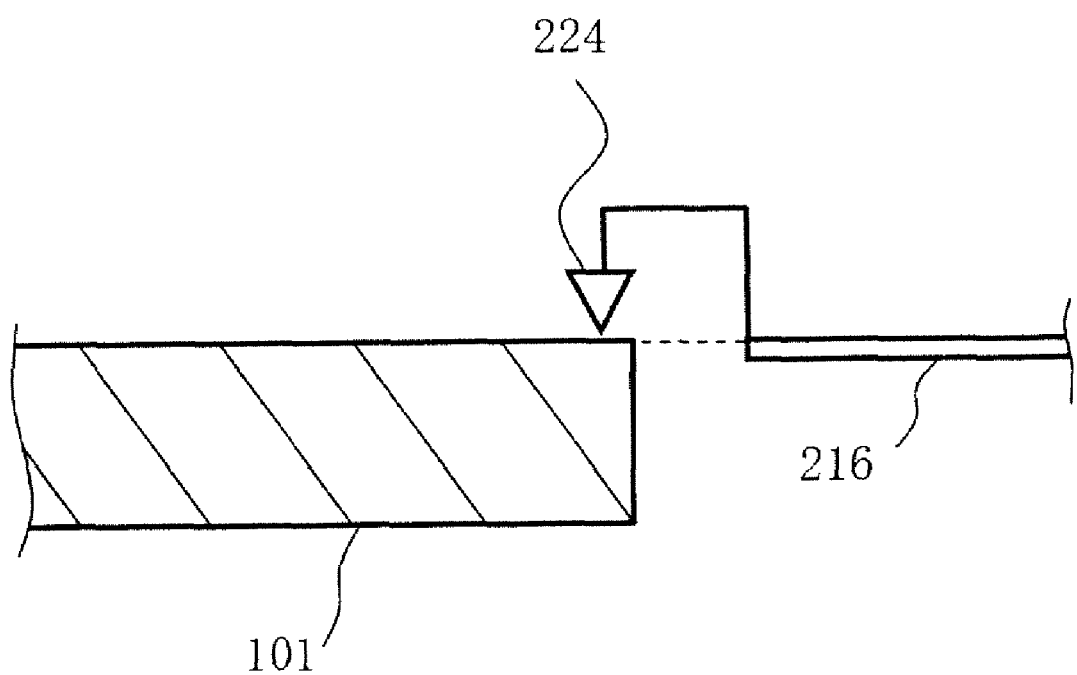
FIG. 15 is a side view of a modified version of the earthing mechanism, which has a pin-like contact structure for contact with the surface of a substrate being processed.
Figure 16:
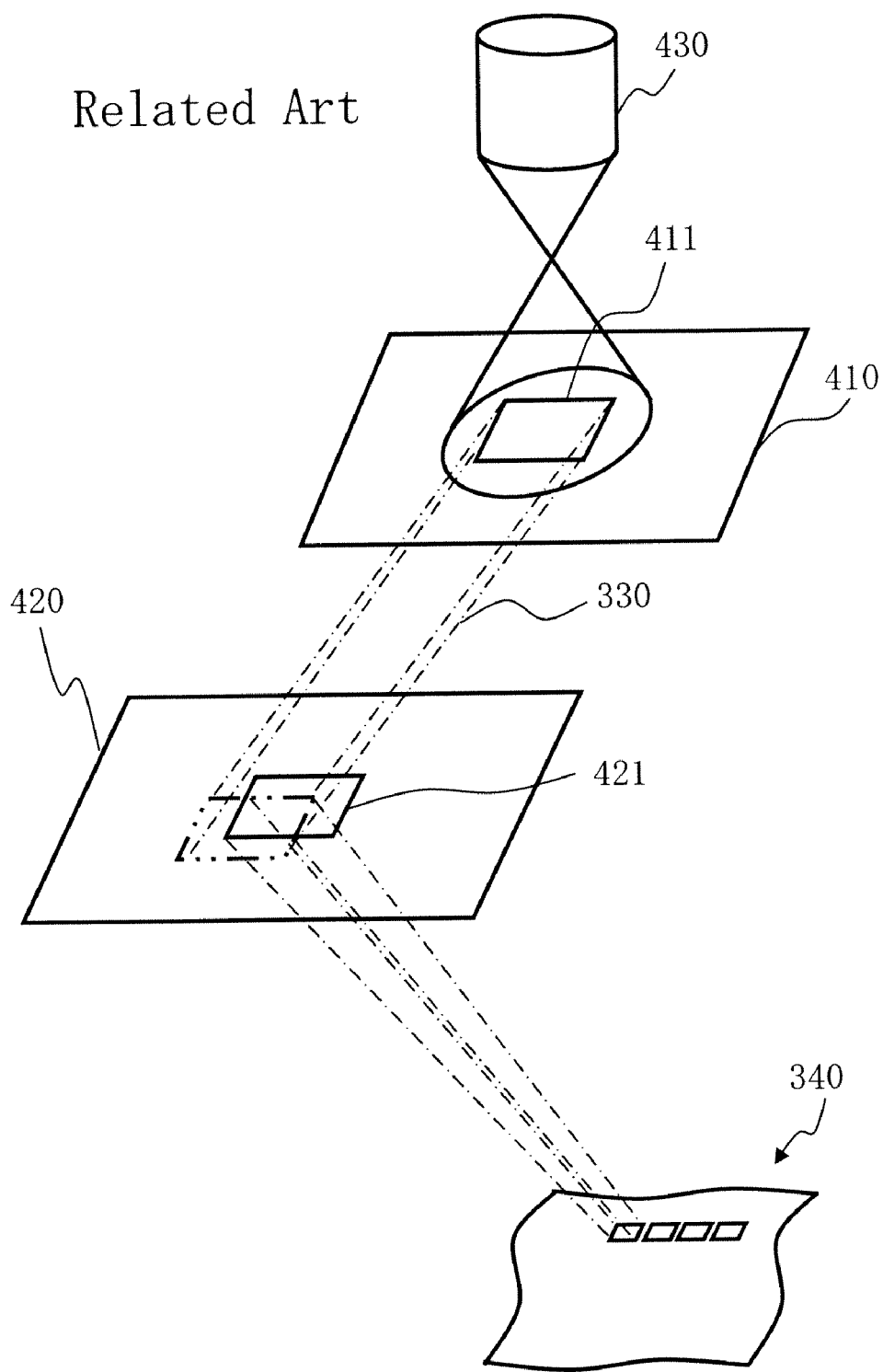
FIG. 16 is a perspective view of optics in one typical variable-shaped electron beam lithography apparatus.

The blade 214 for use as the grounding contact point of earthing mechanism is not restrictive of this invention and may be replaced with other similar suitable contact structures. An example of them is shown in FIG. 15. In this example, a contact pin 224 with a downside end being sharpened like a needlepoint is used as an alternative to the blade 214. This pin 224 is coupled to its associative plate spring 216 by using layout designs similar to those in the previous embodiment—i.e., the layout height of plate spring 216 is substantially the same as the contact starting point of pin 224 with the top surface of substrate 101, while letting pin 224 be disposed at almost the center of plate spring 216 along the width and also be wrapped with the cover 212 shown in FIG. 3.

While the invention has been described with reference to the specific embodiment, the description is illustrative of the invention and is not to be construed as limiting the invention. For example, the plate spring 216 in the illustrative embodiment may be replaced by other elastic biasing plate- or bar-like members of the type having a leading end for attachment of blade 214 or pin 224 and being elastically deformable with a root as the base to apply elastic biasing force to substrate 101 when pushed up thereby. An example is that a spiral spring is attached to the root of such plate- or bar-like resilient member for biasing and pressing blade 214 against substrate 101 by the repulsive force of such spiral spring.

Although a detailed explanation is eliminated as to those parts which are not directly relevant to the principles of this invention and deemed obvious to a skilled person, such as apparatus configurations and control techniques, these parts are arrangeable, without requiring any inventive activities, by use of currently available designs on a case-by-case basis. For instance, a system controller for control of EB lithographic apparatus 100 of FIG. 1 is designable by using known schemes in an appropriate way.

Other substrate earthing mechanisms and charged-particle beam pattern writing tools which comprise the elements of this invention and which are modifiable by technicians based on the teachings as set forth herein should be interpreted to be involved in the coverage of the invention.

Additional advantages and modifications will readily occur to those skilled in the art. The invention in its broader aspects is not limited to the specific details and illustrative embodiments shown and described herein. Various modifications and alterations may be made by those skilled in the art without departing from the spirit and scope of the general inventive concept as defined by the appended claims and equivalents thereto.

What is claimed is:

1. A mechanism for coupling a substrate to ground potential, comprising:
    a plate-like spring extending toward the substrate in a direction parallel to a surface of the substrate; and
    a contact portion coupled to a tip end of the plate-like spring for coming into contact with the substrate to thereby provide electrical conduction therebetween, wherein
    said plate-like spring and said contact portion are disposed such that a contact position at which said contact portion is in contact with the substrate and a layout position of said plate-like spring are substantially the same in a direction at right angles to the substrate surface in a state that said plate-like spring is out of its elastic deformation; wherein
    said contact portion is substantially centrally disposed in a width direction of said plate-like spring.

2. The mechanism according to claim 1, wherein an offset value in the direction at right angles to the substrate surface between the contact position at which said contact portion is in contact with the substrate and the layout position of said plate-like spring in the state that said plate-like spring is out of its elastic deformation is within plus/minus one millimeter (±1 mm).

3. A charged-particle beam writing apparatus comprising:
    a stage structure elevatably mounting thereon a substrate to be written with a pattern by using a charged particle beam;
    a contact portion arranged contactable with the substrate by elevation of the substrate to thereby make electrical conduction with said substrate; and
    a plate-like spring member extending toward said substrate in a direction parallel with a surface of said substrate for causing said contact portion to be connected thereto substantially at a tip end of the plate-like spring, wherein
    said contact portion and said plate-like spring member are disposed so that a contact position at which said contact portion comes into contact with said substrate and a layout position of said plate-like spring member are substantially the same as each other with respect to an elevating direction of the stage in a state that said plate-like spring member is out of elastic deformation.

4. The mechanism according to claim 1, further comprising:
    a cover overlying said contact portion while having a gap space between the cover and the substrate surface in a direction extending toward at least a central portion of said substrate from the position whereat said contact portion is in contact with said substrate.

5. The mechanism according to claim 1, wherein said contact portion includes any one of a blade with a knife edge and a pin.

6. The mechanism according to claim 1, wherein said substrate has thereon a conductive film and a resist film on or above said conductive film, and wherein said contact portion cuts into the resist film for making electrical conduction with the conductive film.

7. The apparatus according to claim 3, wherein said substrate has thereon a conductive film and a resist film above the conductive film, and wherein said contact portion cuts into said resist film for making electrical conduction with said conductive film.

8. The apparatus according to claim 3, wherein an offset value in the direction at right angles to the substrate surface between the contact position at which said contact portion is in contact with the substrate and the layout position of said plate-like spring in the state that said plate-like spring is out of its elastic deformation is within ±1 mm.

9. The apparatus according to claim 3, wherein said contact portion is substantially centrally disposed in a width direction of said plate-like spring member.

10. The apparatus according to claim 3, further comprising:
    a cover overlying said contact portion while having a gap space between the cover and the substrate surface in a direction extending toward at least a central portion of said substrate from the position whereat said contact portion is in contact with said substrate.

11. The apparatus according to claim 3, wherein said contact portion includes any one of a blade with a knife edge and a pin.

* * * * *